(12) United States Patent
Samarao et al.

(10) Patent No.: US 10,035,699 B2
(45) Date of Patent: Jul. 31, 2018

(54) ANTI-GETTER: EXPANDABLE POLYMER MICROSPHERES FOR MEMS DEVICES

(71) Applicant: Robert Bosch GmbH, Stuttgart (DE)

(72) Inventors: Ashwin K. Samarao, Sunnyvale, CA (US); Gary O'Brien, Palo Alto, CA (US); Ando Feyh, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/534,477

(22) PCT Filed: Dec. 10, 2015

(86) PCT No.: PCT/US2015/065061
§ 371 (c)(1),
(2) Date: Jun. 8, 2017

(87) PCT Pub. No.: WO2016/094700
PCT Pub. Date: Jun. 16, 2016

(65) Prior Publication Data
US 2017/0362078 A1      Dec. 21, 2017

Related U.S. Application Data

(60) Provisional application No. 62/089,898, filed on Dec. 10, 2014.

(51) Int. Cl.
*H01L 23/31* (2006.01)
*B81C 1/00* (2006.01)
*B81B 7/00* (2006.01)

(52) U.S. Cl.
CPC ........ *B81B 7/0038* (2013.01); *B81C 1/00285* (2013.01); *B81B 2201/0235* (2013.01); *B81B 2201/0242* (2013.01)

(58) Field of Classification Search
CPC ....... H01L 21/78; H01L 21/77; H01L 23/053; H01L 23/3114; H01L 23/3121;
(Continued)

(56) References Cited

U.S. PATENT DOCUMENTS 5,689,089 A   11/1997  Polak et al.
6,099,948 A    8/2000  Paver, Jr.
(Continued)

OTHER PUBLICATIONS

International Search Report corresponding to PCT Application No. PCT/US2015/065061, dated Mar. 23, 2016 (3 pages).

*Primary Examiner* — Andrew Q Tran
(74) *Attorney, Agent, or Firm* — Maginot Moore & Beck LLP

(57) ABSTRACT

A method of fabricating a MEMS device includes depositing an expandable material into a first recess of a cap wafer. The cap wafer includes a plurality of walls that surround and define the first recess and a second recess. The cap wafer is bonded to a MEMS wafer including a first MEMS device and a second MEMS device. The first MEMS device is encapsulated in the first recess, and the second MEMS device is encapsulated in the second recess. The expandable material is then heated to at least an activation temperature to cause the expandable material to expand after the first recess has been sealed. The expansion of the expandable material causes a reduction in volume of the first recess.

19 Claims, 5 Drawing Sheets

(58) Field of Classification Search
CPC . H01L 23/3142; H01L 23/315; B81B 7/0038; B81C 1/00285
See application file for complete search history.

(56) References Cited

U.S. PATENT DOCUMENTS

| | | | |
|---|---|---|---|
| 7,047,633 B2 * | 5/2006 | Morganelli | H01L 21/563 |
| | | | 174/259 |
| 7,981,849 B2 | 7/2011 | Feger et al. | |
| 8,438,718 B2 * | 5/2013 | Aono | G01C 19/56 |
| | | | 257/666 |
| 9,919,914 B2 * | 3/2018 | Cheng | B81B 7/0006 |
| 2004/0234689 A1 | 11/2004 | Morganelli et al. | |
| 2011/0209815 A1 | 9/2011 | Aono et al. | |

* cited by examiner

ANTI-GETTER: EXPANDABLE POLYMER MICROSPHERES FOR MEMS DEVICES

CROSS-REFERENCE TO RELATED APPLICATIONS

This application is a 35 U.S.C. § 371 National Stage Application of PCT/US2015/065061, filed on Dec. 10, 2015, which claims priority to U.S. Provisional Application Ser. No. 62/089,898 entitled "ANTI-GETTER: EXPANDABLE POLYMER MICROSPHERES FOR MEMS" and filed Dec. 10, 2014. The disclosures of the above-identified patent applications are both incorporated by reference herein in their entirety.

TECHNICAL FIELD

The disclosure relates generally to micromechanical electrical system (MEMS) devices and in particular to processes and methods of fabricating MEMS devices.

BACKGROUND

MEMS devices, such as pressure sensors, accelerometers, gyroscopes, and the like, typically comprise a sensor structure having a characteristic that can vary and that is altered in a predictable manner through interaction with an external factor, such as heat, humidity, pressure, movement, and the like. The sensor structure is configured to act as part of a transduction system for the MEMS device which uses the varying characteristic of the sensor structure to generate an electrical signal having a value is indicative of the external factor.

MEMS devices are typically encapsulated in some manner to protect and isolate the device from contamination from undesired environmental factors, such as heat, humidity, dust, and the like, which could adversely impact device performance. The encapsulation often requires hermetic seals to protect the ambient environment in order to ensure optimal operation. Some MEMS devices also require a specific vacuum ambient for optimal operation. For example, MEMS bolometers and gyroscopes require high vacuum, e.g., ~10 µbar, while MEMS accelerometers require low vacuum, ~10 mbar.

The different vacuum requirements of different devices has made it difficult to achieve optimal vacuum level requirements for different MEMS devices incorporated onto the same chip. FIG. 1 depicts a device 10 that includes a MEMS wafer 12 on which a MEMS accelerometer 14 and a MEMS gyroscope 16 have been fabricated. A cap wafer 18 is bonded onto the MEMS wafer 12 which defines cavities 20, 22 over both the MEMS accelerometer 14 and the MEMS gyroscope 16 which are separated by a dividing wall 24. Current MEMS packaging typically happens at a wafer level, which results in all the devices typically sealed at the same vacuum levels. 'Getter' materials are typically used to locally evacuate the sealed cavities 20, 22 to achieve the desired vacuum level for certain devices, such as the gyroscope 16 of FIG. 1. A getter material is typically some alloy material capable of absorbing air molecules (N2, O2, H2 etc.,) into its interstitial spaces thereby evacuating the sealed ambient to high vacuum levels. Getter materials may not be capable of achieving the required vacuum ambient for different MEMS devices when starting from the same sealed vacuum level.

SUMMARY

According to one embodiment of the present disclosure, a method of fabricating a microelectromechanical system (MEMS) device includes depositing an expandable material into a first recess of a cap wafer. The cap wafer includes a plurality of walls that surround and define the first recess and a second recess. The plurality of walls includes at least one dividing wall that separates the first recess from the second recess. The expandable material has an activation temperature at which the expandable material expands. The cap wafer is pressed onto a MEMS wafer. The MEMS wafer includes a first MEMS device and a second MEMS device which are integrated into the same MEMS wafer. The plurality of walls of the cap wafer are pressed against the MEMS wafer such that the first MEMS device is encapsulated in the first recess and the second MEMS device is encapsulated in the second recess. The first recess has a first pressure level and the second recess has a second pressure level. The first pressure level and the second pressure level are substantially equal when the cap wafer is pressed onto the MEMS wafer. The cap wafer and the MEMS wafer are then heated to a bonding temperature, the bonding temperature to cause the plurality of walls of the cap wafer to bond to MEMS wafer such that a first volume is sealed within the first recess and a second volume is sealed within the second recess. The bonding temperature is greater than the activation temperature such that the expandable material expands within the first recess after the first volume is sealed within the first recess.

In another embodiment, a method of fabricating a microelectromechanical system (MEMS) device includes depositing an expandable material into a first recess of a cap wafer and then bonding the cap wafer onto a MEMS wafer such that a first MEMS device is encapsulated in the first recess and a second MEMS device is encapsulated in a second recess of the cap wafer. The bonding results in a first volume being sealed within the first recess and a second volume being sealed within the second recess, the first volume being sealed at a first pressure level and the second volume being sealed at a second pressure level. The expandable material is then heated to the activation temperature such that the expandable material expands within the first recess.

In yet another embodiment, a microelectromechanical system (MEMS) device comprises a MEMS wafer including a first MEMS device and a second MEMS device, and a cap wafer bonded to the MEMS wafer. The cap wafer includes a first recess that encapsulates the first MEMS device and a second recess that encapsulates the second MEMS device with a first volume being sealed in the first recess and a second volume being sealed in the second recess. Expanded polymer microspheres are sealed within in the first recess, the polymer microspheres having been heated to an activation temperature to cause expansion of the polymer microspheres.

DESCRIPTION

Figure 1:
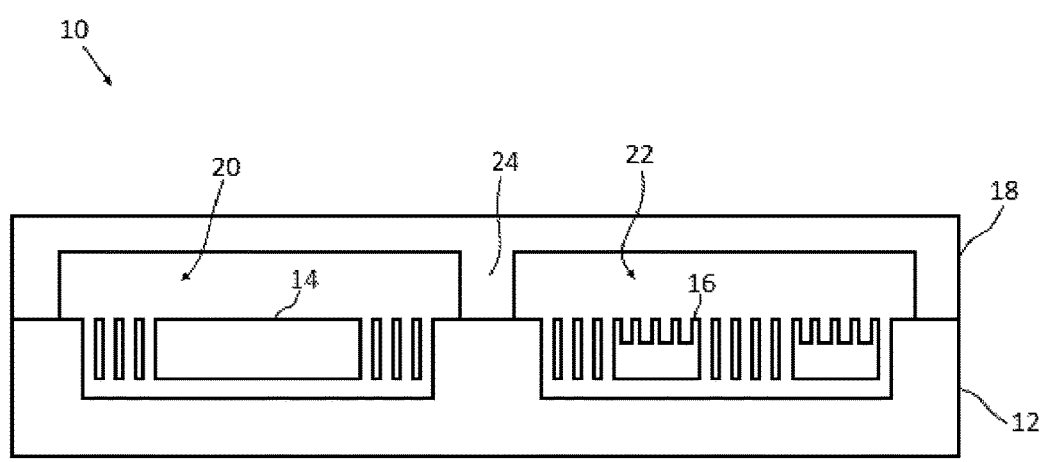
FIG. 1 is a schematic depiction of a prior art fabrication process utilizing a getter alone to provide a desired vacuum level for a device.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to a person of ordinary skill in the art to which this disclosure pertains.

The present disclosure is directed to methods of fabricating semiconductor devices, such as MEMS sensors, and in particular, MEMS inertial sensors, that enables a wider range of vacuum levels to be achieved in sealed cavities which are incorporated into the same wafer and sealed at the same vacuum level. The disclosure is based in part on the idea that instead of absorbing air molecules and evacuating sealed cavities to high vacuum levels (i.e., low pressure levels), the sealed vacuum level may be decreased to a low vacuum level (i.e., high pressure level) by reducing the volume within the cavity after it has been sealed.

To reduce the volume within a sealed cavity after the cavity has been sealed, an expandable material is deposited inside the cavities that are to have higher pressure levels which is activated after the cavity has been sealed to reduce the volume of the cavity. One example of an expandable material for use in reducing the volume of sealed cavities comprises expandable polymer microspheres. Expandable microspheres are typically about 10 microns in diameter. The outer shells of these microspheres are made of a thermoplastic organic material like an acrylonitrile co-polymer. This outer shell of the microsphere seals in a low-boiling point hydrocarbon inside.

When such polymer microspheres are heated to a certain set temperature, the outer shell softens and becomes more plastic-like while the sealed-in hydrocarbon expands exerting a pushing force on the wall of this softened shell resulting in expansion. Under repeated tests 10 micron microspheres were found to expand to about 200 microns (i.e., 20 times its original volume). Since the thermoplastic shell layer is non-porous even while soft and plastic at high temperatures, the hydrocarbon emission from inside of the microspheres in the form of Volatile Organic Compounds (VOCs) are very minimal thus making these spheres also a 'clean' micro technology.

A portion of a process of fabricating MEMS devices that utilizes expandable polymer microspheres is depicted in FIGS. 2-6. In FIGS. 2-6, the MEMS devices 30, 32 are provided on a silicon chip or wafer 34. The wafer 34 is depicted after undergoing processes to form semiconductor components, including the MEMS devices 30, 32, thereon, and after being capped with a cap wafer 36, e.g., polysilicon, to encapsulate the components on the wafer 34. In the embodiment of FIGS. 2-6, the semiconductor components comprise a MEMS accelerometer 30 and a MEMS gyroscope 32. In other implementations, a plurality of MEMS accelerometers and a plurality of MEMS gyroscopes may be provided on the wafer. Alternatively, other types of MEMS devices may be provided on the wafer in addition to or as an alternative to the devices depicted in FIGS. 2-6.

Figure 2:
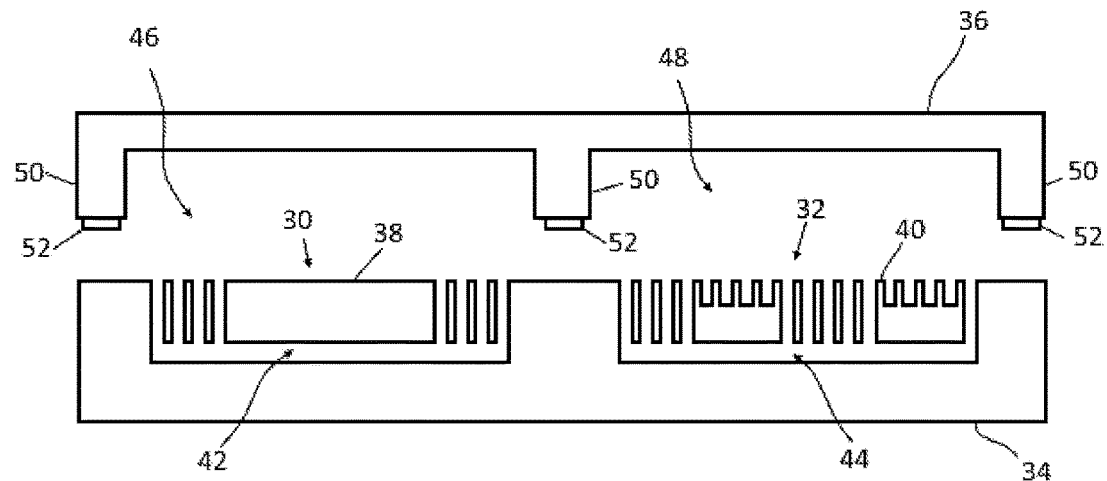
FIG. 2 is a schematic depiction of a MEMS during a fabrication process after MEMS devices have been formed on a first wafer and a cap wafer is in position for bonding to the first wafer.

As depicted in FIG. 2, the MEMS accelerometer 30 and the MEMS gyroscope 32 each include a thin membrane 38, 40 that is provided over a cavity 42, 44 formed in the wafer 34. The cap wafer 36 includes recesses 46, 48 which encapsulate the MEMS devices when the cap wafer 36 is placed on the wafer. The cap wafer 36 includes walls 50 which form barriers between and around the MEMS devices 30, 32 on the wafer 34. The barrier walls 50 of the cap wafer 36 are bonded to the wafer 34 using a suitable bonding material/process 52.

Figure 3:
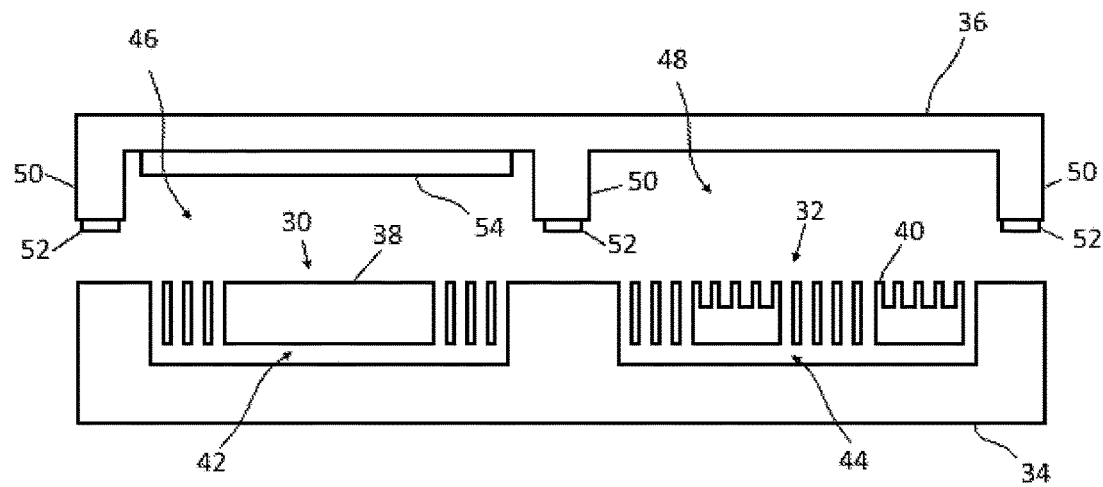
FIG. 3 depicts the MEMS of FIG. 2 after expandable microspheres have been deposited within a recess on the cap wafer.

Referring to FIG. 3, before the wafers 34, 36 are bonded together, an expandable material 54, such as expandable polymer microspheres, is deposited within any recesses which are to encapsulate the devices which require a high pressure level within the sealed cavity, which in this case, includes the MEMS accelerometer 30. In this case, the expandable material 54 is deposited into the recess 46 for the MEMS accelerometer 30. The expandable material 54 may be deposited in any suitable manner, such as screen printing, and may undergo further processing, such as patterning, to achieve the desired formation of expandable material within the recess. Note that during wafer-scale bonding, the pressure level may reach as low as 5e-7 bar (or even lower) before bonding commences so the process used to deposit the microspheres will have to be compatible with pressures approaching vacuum.

Figure 4:
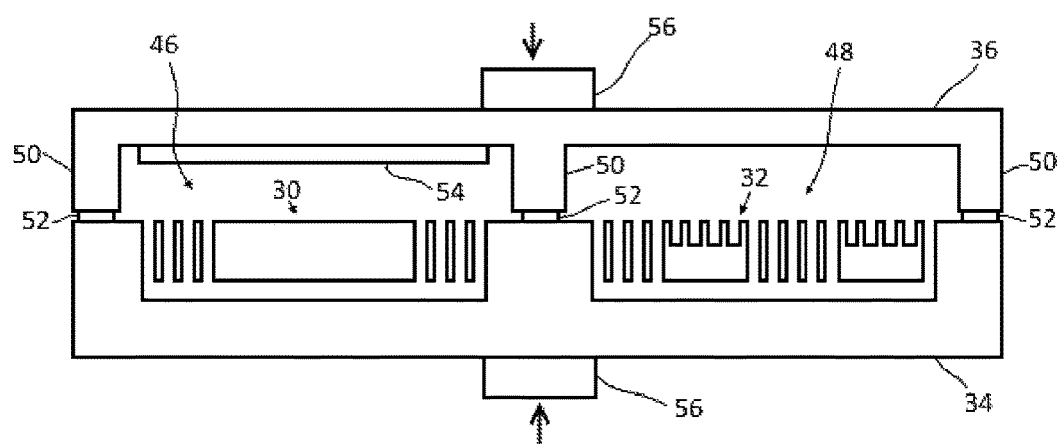
FIG. 4 depicts the MEMS of FIG. 3 the wafers have been moved into contact with each other and a bond force has been applied.
Figure 5:
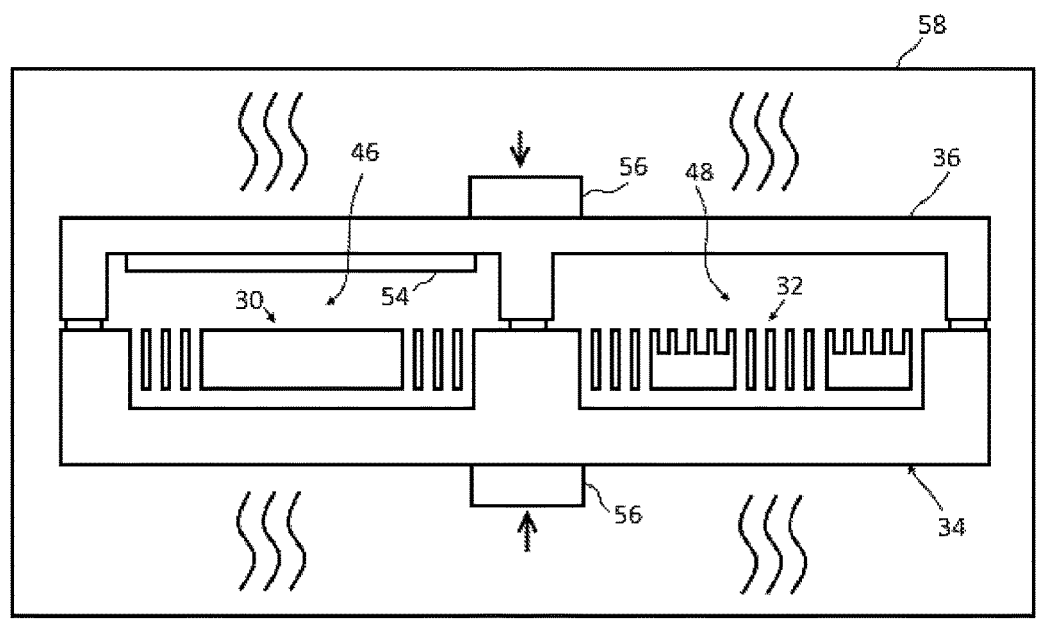
FIG. 5 depicts the MEMS of FIG. 4 after being heated to a bonding temperature which is above the activation temperature of the microspheres and which has caused the expansion of the microspheres within the recess.

Referring now to FIG. 4, the wafer bonding is performed by bringing the two wafers 34, 36 into contact within a bonding chamber 58 and applying a bonding force using a clamping device 56, such as a piston or other type of mechanism. The bonding force is applied to correct for any wafer stress/warp and bring the wafers uniformly and firmly into contact with each other. With the wafers 34, 36 pressed together, the temperature is increased, as depicted in FIG. 5, to a bonding temperature which depends on the type of bonding material/processes used. For example, the bonding temperature would be the eutectic temperature in case of a eutectic bonding.

Typically the bonding temperature is well above the activation temperatures of the expandable microspheres. As a result, expansion of the microspheres occurs within the sealed cavity of the MEMS accelerometer in parallel with the bonding process. Typical polymer microspheres have an activation temperature of 90°C. to 160° C. Since typical bond temperatures are above 300-400° C., the bond force should be applied and the wafers should be brought firmly into contact with each other before applying the bond temperature so the expansion of the polymer microspheres (and subsequent reduction of entrapped volume) happens within the recesses of the cap wafer. Since a temperature of 90° C. to 160° C. is typically a very low thermal budget considering the typical micro- and nanofabrication processes, the application of expandable polymer microspheres is one of the last steps in a fabrication process flow (similar to a getter material).

Figure 6:
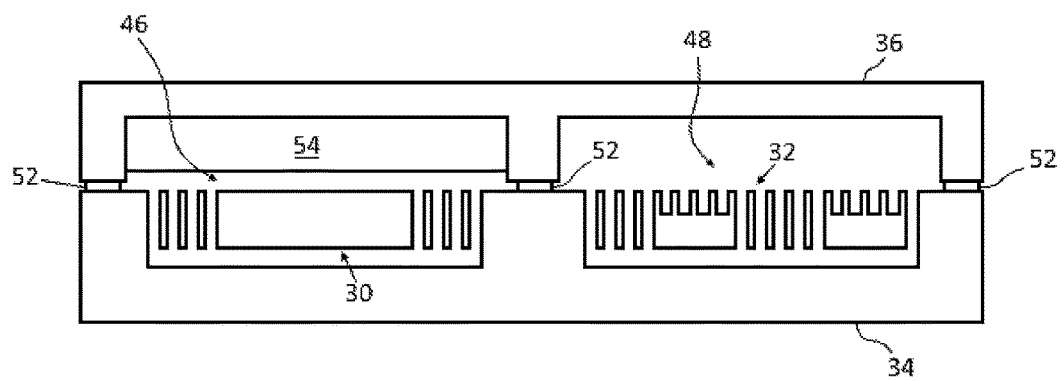
FIG. 6 depicts the MEMS of FIG. 5 after the bond has been completed and the microspheres have expanded to reduce the volume within the recess.

After the completion of the bond, the volume of the sealed cavity 46 for the accelerometer 30 (in this case) is considerably smaller than the volume of the sealed cavity 48 of the gyroscope 32 due to the expansion of the polymer microspheres 54, as can be seen in FIGS. 5 and 6. The reduction in volume of the sealed cavity 46 enables the sealed in pressure level for the MEMS accelerometer 30 to be orders of magnitude higher than the pressure level in the other recess 48 which, in this case, encapsulates the gyroscope 32. For example, due to expansion of microspheres and a resulting reduction in cavity volume, the sealed in pressure for the MEMS accelerometer 30 in the recess 46 may be as high as 10~100 mbar while the sealed in pressure in the recess 48 for the MEMS gyroscope 32 may be about 10~100 μbar.

There are different types of expandable polymer microspheres available having formulations which allow different degrees of expansion and/or have different activation temperatures at which they expand. Therefore, the amount of desired volume reduction may be achieved by selecting the microspheres which exhibit the desired level of expansion and have an activation temperature which is lower than the bonding temperature to be utilized. To precisely control the amount of volume expansion from the polymer microspheres, partially expanded microspheres can also be used in addition to carefully planning the area of application within the recesses of the cap wafer.

By combining the use of expandable microspheres and getters in a fabrication process, less stringent pressure requirements can be utilized within the bonding chamber because the use of both expandable microspheres and getters widens the range of pressure levels that may be achieved from a given vacuum level sealed within a cavity. For example, when only a getter is used, the chamber 58 would need to be pumped down to the pressure that is required to seal-in the accelerometer cavity (e.g., 10-100 mbar) while the rest of lowering of pressure in the gyroscope cavity (e.g., to 10-100 μbar) has to be effected using the getter. When expandable microspheres are used alone, the chamber 58 would need to be pumped down to a very low vacuum level (<10 μbar) and although this could seal-in the desired vacuum in the gyroscope cavity, the accelerometer cavity would have to rely purely on the expandable microspheres to bring up the sealed-in pressure by two to three orders of magnitude. If the cavity dimensions were not sufficiently large, such a wide range of pressure variation might not be possible using just the microspheres.

Figure 7:
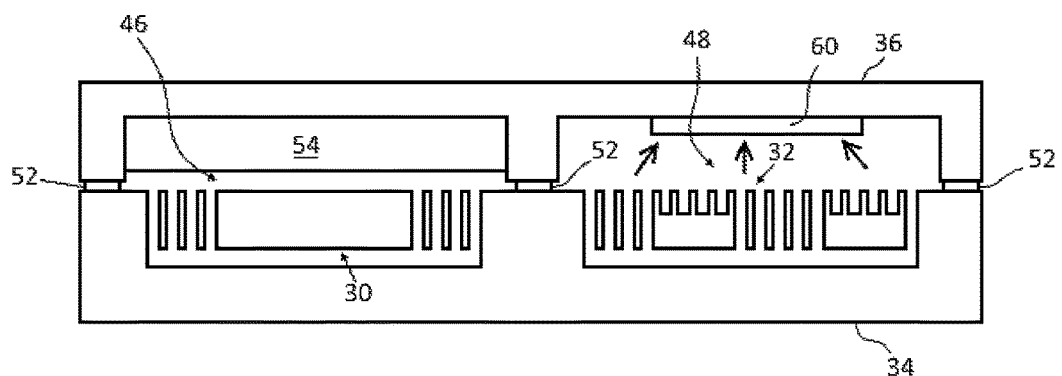
FIG. 7 depicts an example of a MEMS in which both expandable microspheres and a getter is utilized.

FIG. 7 depicts an embodiment in which an expandable material is used for volume reduction and increasing pressure in a first recess for a first MEMS device and a getter material is used for decreasing pressure in a second recess for a second MEMS device. As depicted in FIG. 7, the first MEMS device 30 comprises a MEMS accelerometer and the second MEMS device 32 comprises a MEMS gyroscope. An expandable material 54, such as polymer microspheres, is deposited into the recess 46 for the first MEMS device 30, which has a higher pressure specification than the second MEMS device 32. The getter material 60 is deposited into the recess 48 for the second MEMS device. The cap wafer 36 is then bonded to the MEMS wafer 34, e.g., through the application of pressure and heat, to seal a first volume within the first recess 46 and a second volume within the second recess 48. Simultaneously, with the application of heat which is greater than an activation temperature of the expandable material, the expansion of the expandable material occurs which reduces the first volume within the first recess after the first recess has been sealed and causes in increase in pressure within the first recess by one/two orders of magnitude to approximately 10-100 mbar. In addition, during the bond process, the getter absorbs air molecules which causes a reduction in pressure within the second recess by one/two orders of magnitude to approximately 10-100 μbar. When both expandable microspheres 54 and a getter is used, as depicted in FIG. 7, the chamber 58 could be pumped down to a more reasonable value, e.g., 1 mBAR, than would otherwise be possible.

Figure 8:
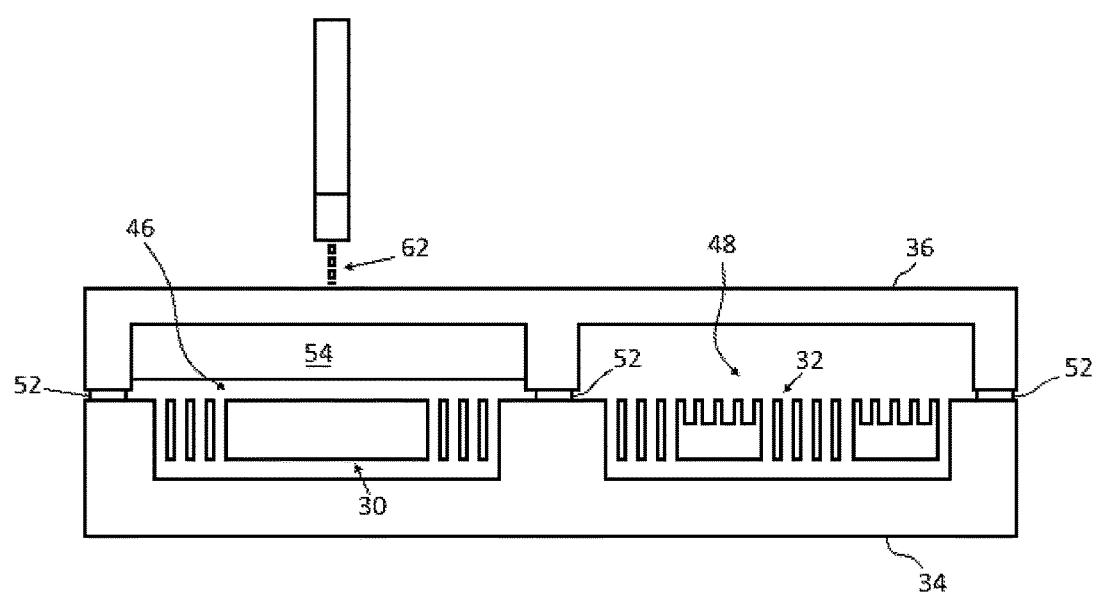
FIG. 8 depicts an example of a post-bonding process which may be used to activate the expansion of the microspheres.

As an alternative to expanding the microspheres during the bonding process, a post-bonding process may be used to activate the expansion of the microspheres. The bonding could therefore be carried out at much lower temperature which allows low temperature bonding processes, such as Silicon direct bond or other low temperature eutectic or intermetallic phase bonds, to be used. After the low-temperature bonding has been performed, a post-bond heating process may be used to heat the microspheres to the activation temperature. For example, as depicted in FIG. 8, an infrared laser 62 may be used to locally heat the microspheres to expand the microspheres in targeted zones.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A method of fabricating a microelectromechanical system (MEMS) device, comprising:
   depositing an expandable material into a first recess of a cap wafer, the cap wafer including a plurality of walls that surround and define the first recess and a second recess, the expandable material not being deposited into the second recess, the plurality of walls including at least one dividing wall that separates the first recess from the second recess, the expandable material having an activation temperature at which the expandable material expands;
   pressing the cap wafer onto a MEMS wafer, the MEMS wafer including a first MEMS device and a second MEMS device which are integrated into the same MEMS wafer, the plurality of walls of the cap wafer being pressed against the MEMS wafer such that the first MEMS device is encapsulated in the first recess and the second MEMS device is encapsulated in the second recess, the first recess having a first pressure level and the second recess having a second pressure level, the first and second pressure levels being substantially equal when the cap wafer is pressed onto the MEMS wafer; and
   heating the cap wafer and the MEMS wafer with the cap wafer pressed onto the MEMS wafer to a bonding temperature, the bonding temperature causing the plurality of walls of the cap wafer to bond to MEMS wafer such that a first volume is sealed within the first recess and a second volume is sealed within the second recess, the bonding temperature being greater than the activation temperature such that the expandable material expands within the first recess after the first volume is sealed within the first recess.

2. The method of claim 1, wherein the expansion of the expandable material reduces the first volume within the first recess, the reduction in the first volume increasing the first pressure level such that the first pressure level is greater than the second pressure level.

3. The method of claim 2, wherein, after the expansion of the expandable material, the first pressure level sealed within the first recess is between approximately 10 mbar and approximately 100 mbar and the second pressure level sealed within the second recess is between approximately 10 μbar and 100 μbar.

4. The method of claim 1, wherein the first MEMS device comprises a MEMS accelerometer.

5. The method of claim 4, wherein the second MEMS device comprises a MEMS gyroscope.

6. The method of claim 1, wherein the expandable material comprises polymer microspheres.

7. The method of claim 1, wherein the bonding temperature results in a eutectic bond between the walls of the cap wafer and the MEMS wafer.

8. The method of claim 1, wherein the bonding temperature is 300° C. or greater.

9. The method of claim 8, wherein the activation temperature is approximately 90° C. to approximately 160° C.

10. The method of claim 1, wherein the pressing of the cap wafer onto the MEMS wafer includes clamping the cap wafer and the MEMS wafer together with a bonding force using a clamping device, and
wherein the heating of the cap wafer and the MEMS wafer includes heating the cap wafer and the MEMS wafer while the bonding force is being applied to the cap wafer and the MEMS wafer.

11. The method of claim 1, further comprising:
depositing a getter into the second recess prior to pressing the cap wafer onto the MEMS wafer, the getter causing a reduction in the second pressure level in the second recess after the second volume has been sealed within the second recess.

12. A method of fabricating a microelectromechanical system (MEMS) device, comprising:
depositing an expandable material into a first recess of a cap wafer, the cap wafer including a plurality of walls that surround and define the first recess and a second recess, the expandable material not being deposited into the second recess, the plurality of walls including at least one dividing wall that separates the first recess from the second recess, the expandable material having an activation temperature at which the expandable material expands;
bonding the cap wafer onto a MEMS wafer, the MEMS wafer including a first MEMS device and a second MEMS device which are integrated into the same MEMS wafer, the plurality of walls of the cap wafer being bonded to the MEMS wafer such that the first MEMS device is encapsulated in the first recess and the second MEMS device is encapsulated in the second recess, the bonding resulting in a first volume being sealed within the first recess and a second volume being sealed within the second recess, the first volume being sealed at a first pressure level and the second volume being sealed at a second pressure level; and
heating the expandable material to the activation temperature such that the expandable material expands within the first recess.

13. The method of claim 12, wherein the expansion of the expandable material reduces the first volume within the first recess, the reduction in the first volume resulting in an increase in the first pressure level.

14. The method of claim 12, wherein the first MEMS device comprises a MEMS accelerometer.

15. The method of claim 14, wherein the second MEMS device comprises a MEMS gyroscope.

16. The method of claim 12, wherein the expandable material comprises polymer microspheres.

17. The method of claim 12, wherein the local heating is performed using an infrared laser.

18. A microelectromechanical system (MEMS) device comprising:
a MEMS wafer including a first MEMS device and a second MEMS device;
a cap wafer bonded to the MEMS wafer, the cap wafer including a first recess that encapsulates the first MEMS device and a second recess that encapsulates the second MEMS device, a first volume being sealed in the first recess and a second volume being sealed in the second recess; and
expanded polymer microspheres sealed within in the first recess, the polymer microspheres having been heated to an activation temperature to cause expansion of the polymer microspheres.

19. The MEMS device of claim 18, wherein the first MEMS device is an accelerometer and the second MEMS device is a gyroscope.

* * * * *